(12) United States Patent
Yu et al.

(10) Patent No.: US 10,867,832 B2
(45) Date of Patent: Dec. 15, 2020

(54) APPARATUS FOR HOLDING SEMICONDUCTOR WAFERS

(71) Applicant: Taiwan Semiconductor Manufacturing Company, Ltd., Hsin-Chu (TW)

(72) Inventors: Chen-Hua Yu, Hsin-Chu (TW); Chien Ling Hwang, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 1280 days.

(21) Appl. No.: 14/101,052

(22) Filed: Dec. 9, 2013

(65) Prior Publication Data

US 2014/0097175 A1    Apr. 10, 2014

Related U.S. Application Data

(62) Division of application No. 12/347,580, filed on Dec. 31, 2008, now Pat. No. 8,652,260.

(60) Provisional application No. 61/087,468, filed on Aug. 8, 2008.

(51) Int. Cl.
*H01L 21/687*   (2006.01)
*H01L 21/67*    (2006.01)
*H01L 21/683*   (2006.01)

(52) U.S. Cl.
CPC .. *H01L 21/68742* (2013.01); *H01L 21/67103* (2013.01); *H01L 21/6831* (2013.01); *H01L 21/6833* (2013.01)

(58) Field of Classification Search
CPC ............ H01L 21/68742; H01L 21/6875
See application file for complete search history.

(56) References Cited

U.S. PATENT DOCUMENTS

| | | | | |
|---|---|---|---|---|
| 4,724,621 A | * | 2/1988 | Hobson | H01L 21/68742 118/725 |
| 4,836,733 A | * | 6/1989 | Hertel | H01L 21/67259 198/341.05 |
| 6,227,786 B1 | | 5/2001 | Tateyama | |
| 7,764,355 B2 | | 7/2010 | Ohmi et al. | |

(Continued)

FOREIGN PATENT DOCUMENTS

| CN | 101114605 A | 1/2008 |
|---|---|---|
| KR | 2006056653 A | 5/2006 |

(Continued)

OTHER PUBLICATIONS

Machine Translation of KR 10-2006-0056653. Published May 25, 2006. 7 pages.*

*Primary Examiner* — Karla A Moore
*Assistant Examiner* — Margaret D Klunk
(74) *Attorney, Agent, or Firm* — Slater Matsil, LLP (57) ABSTRACT

Apparatus for holding semiconductor wafers during semiconductor manufacturing processes are disclosed. In one embodiment, the apparatus comprises a heat-conductive layer disposed on a supporting base. The apparatus also comprises a plurality of holes formed through the heat-conductive layer and the supporting base. The apparatus further comprises a plurality of heat-conductive lift pins that extend through the holes over the heat-conductive layer at the top end, and make a direct contact with a wafer substrate. The heat-conductive layer and the lift pins are connected to a heating circuit.

18 Claims, 11 Drawing Sheets

(56) References Cited

U.S. PATENT DOCUMENTS

| | | |
|---|---|---|
| 2002/0102684 A1 | 8/2002 | Rossman |
| 2002/0113056 A1 | 8/2002 | Sugaya et al. |
| 2003/0019583 A1* | 1/2003 | Kopacz ............ H01L 21/68721 156/345.51 |
| 2005/0227494 A1* | 10/2005 | Higuchi ............ H01L 21/31116 438/706 |
| 2007/0012561 A1* | 1/2007 | Bichler ............... C23C 16/4585 204/298.15 |
| 2007/0215049 A1* | 9/2007 | Aderhold .......... H01L 21/67115 118/728 |
| 2010/0212832 A1 | 8/2010 | Wakasaki et al. |

FOREIGN PATENT DOCUMENTS

| | | |
|---|---|---|
| WO | 03001658 A1 | 1/2003 |
| WO | 2007077765 A1 | 11/2007 |

* cited by examiner

APPARATUS FOR HOLDING SEMICONDUCTOR WAFERS

CROSS-REFERENCES

This application is a divisional of U.S. application Ser. No. 12/347,580, entitled "Apparatus for Holding Semiconductor Wafers," filed on Dec. 31, 2008, which claims the benefit of U.S. Provisional Application No. 61/087,468, entitled "Apparatus for Holding Semiconductor Wafers," filed on Aug. 8, 2008, both of which applications are incorporated herein by reference.

TECHNICAL FIELD

The present invention relates generally to an apparatus for holding semiconductor wafers during semiconductor manufacturing processes, and more particularly to wafer holding apparatus and methods that realize wafer temperature uniformity in processes with high heat stress.

BACKGROUND

Manufacturing a semiconductor integrated circuit (IC) typically involves numerous processing techniques that require elevated wafer temperatures to perform the desired processes, such as chemical vapor deposition (CVD), physical vapor deposition (PVD), dry etching, or other processing techniques. As a known wafer holding apparatus, an electrostatic chuck including a heating element is commonly employed to support a semiconductor wafer in a stationary position and transfer heat generated from the heating element to the wafer during the various processes.

Figure 1:
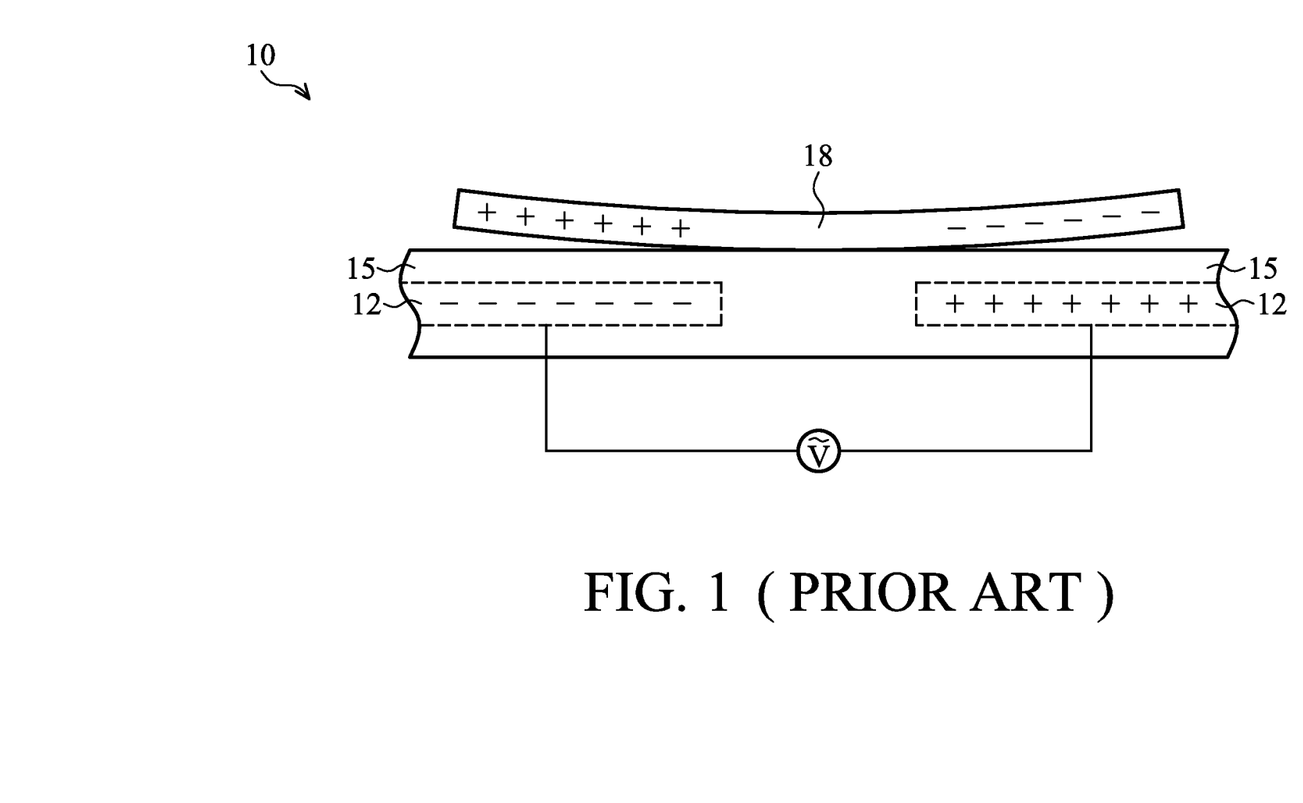
FIG. 1 illustrates a prior art dipole-type electrostatic chuck.

FIG. 1 illustrates a prior art dipole-type electrostatic chuck 10 utilized as a wafer supporting and heating apparatus. Electrostatic chuck 10 comprises either a pair of or plural pairs of electrodes 12 embedded in a wafer supporting stage, which typically comprises a mounting surface 15 made of heat conducting dielectrics, such as a heat conducting ceramic. When an alternating voltage is applied between the electrodes 12, a reverse polarity charge is typically induced in wafer substrate 18. Wafer substrate 18 is thus electrostatically attracted to the supporting stage utilizing the force generated between the wafer substrate and the electrodes. A heating circuit is also used to supply electricity to the supporting stage to heat the mounting surface 15 of the electrostatic chuck 10. Heat transfer then occurs between mounting surface 15 and wafer substrate 18 held thereon so that wafer substrate 18 reaches a desired temperature range suitable for processing the wafer.

Conventional electrostatic chucks, however, have the following problems. First, during a wafer fabrication process, such as a CVD or impurity doping process, a semiconductor wafer may be subjected to an elevated temperature on the order of 800° C. or higher. The wafer processed within such a high temperature range may be under significant heat stress, which typically causes wafer bowing or warping as illustrated in FIG. 1. This problem causes the wafer substrate 18 to lose direct abutting contact with the mounting surface 15 where the bowing or warping occurs. A considerable portion of the heat generated by mounting surface 15 would be transferred to the wafer spots that contact mounting surface 15, but not to the bowed or warped portions of wafer substrate 18. This causes further temperature non-uniformity in wafer substrate 18.

Additionally, for the system where alternating voltage is applied to the electrodes 12, electric charge is accumulated in the back surface of wafer substrate 18 while the wafer is being attracted, and the accumulated charge makes the separation of the substrate from the chuck difficult. Moreover, although an electrostatic chuck operated through an alternating voltage exerts an attractive force to the wafer substrate held thereon, the attractive force is typically not adapted to the mechanical stress created by the uneven heat distribution in a wafer substrate. As a result, when the mechanical stress accumulated in a wafer substrate exceeds a critical point, the wafer substrate may crack or even break.

Furthermore, the trend of increasing wafer diameter in semiconductor manufacturing continues as part of the effort to increase the throughput of a semiconductor fabrication facility and offset the high cost imposed by the processing equipment in advanced processing technology. The uneven heat distribution as described above may create increased mechanical stress in a wafer substrate of increased dimension, causing more severe bowing or warping effects.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely wafer holding apparatus and methods that realize even temperature distribution in a wafer substrate during processes involving elevated wafer temperature, such as chemical vapor deposition (CVD), impurity doping, rapid thermal process (RTP), anneal, and metal deposition. Preferred embodiments may be used to heat wafer substrates of various diameter, achieving even temperature distribution across a wafer substrate to perform desired processes. Also, preferred embodiments may provide a wafer holding mechanism that is adaptive to the mechanical stress built in a wafer substrate so that the heat-induced mechanical stress built in a wafer substrate during an elevated temperature process may be released in a process with reduced processing temperature. It is noted that, although the present invention has been described in conjunction with specific embodiments, it is to be understood that the present invention is not limited to these embodiments and many modifications and variations may be made without departing from the scope and spirit of the present invention as specifically defined in the preferred embodiments. As an example, preferred embodiments may be used to other semiconductor manufacturing processes where uniform heat distribution on a semiconductor working piece are desired for processing.

Figure 2A:
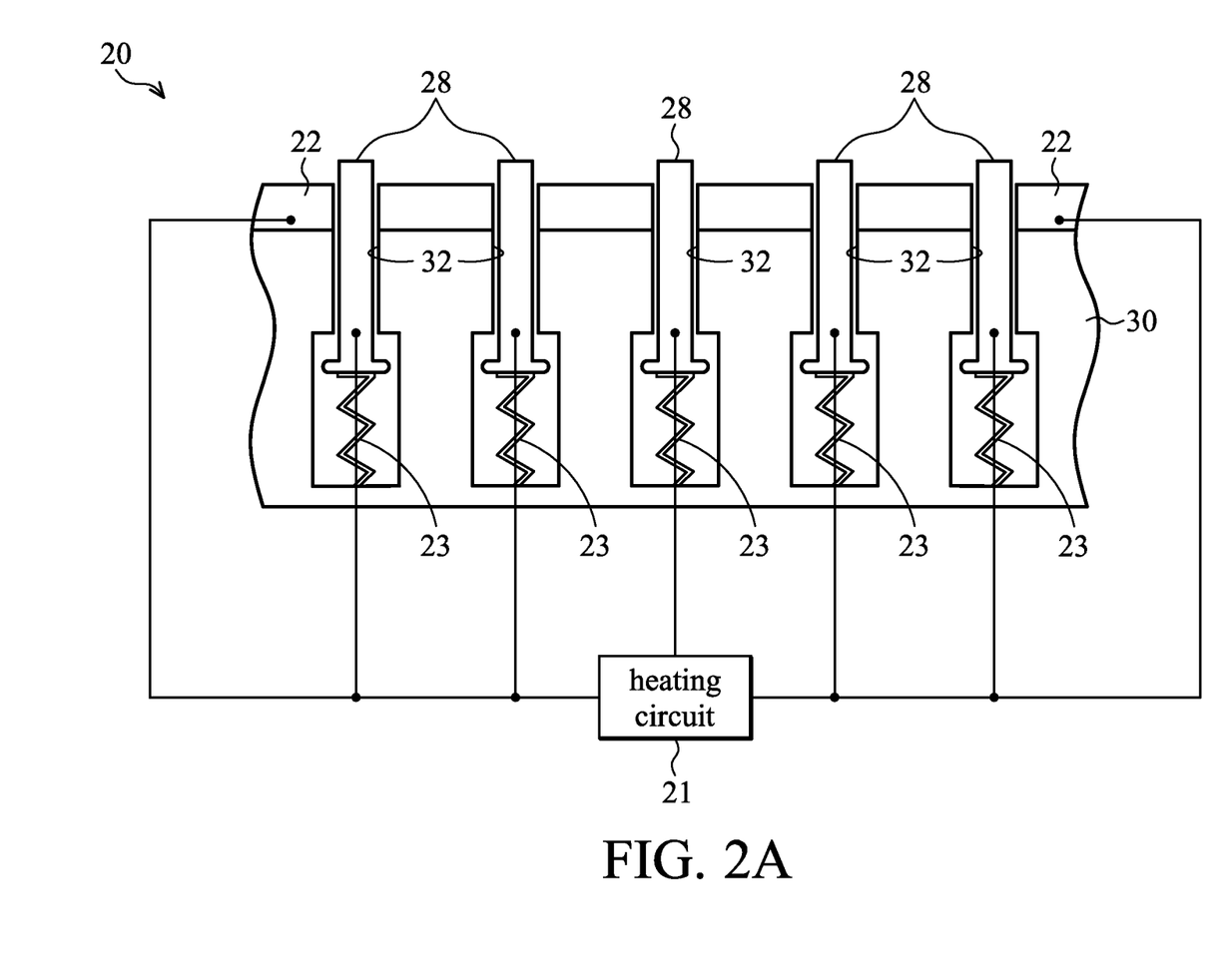
FIGS. 2A, 2B, 3, 4A, and 4B are cross-sectional views of illustrative embodiments of the present invention.

With reference now to FIG. 2A, there is shown a wafer holding apparatus 20 that comprises a heat-conductive layer 22. The heat-conductive layer 22 is supported on a supporting base 30, with the top surface of the heat-conductive layer 22 forming a wafer supporting surface. Therefore, the heat-conductive layer 22 is also sometimes referred to as wafer supporting surface 22 in the description below. The heat-conductive layer 22 may comprise a wide range of materials. In one embodiment, the heat-conductive layer 22 includes a dielectric material, such as aluminum nitride and pyrolytic boron nitride. In another embodiment, heat-conductive layer 22 comprises an electrically conductive material, such as pyrolytic graphite.

A plurality of lift pins 28 extends through holes 32 formed through heat-conductive layer 22 and supporting base 30. Lift pins 28 are made of heat conductive materials similar to those used to form heat-conductive layer 22, such as aluminum nitride, pyrolytic boron nitride and pyrolytic graphite. Each of the lift pins 28 is supported by an elastic spring 23 attached to supporting base 30. A heating circuit 21 is used to supply electricity to the wafer supporting surface 22 and lift pins 28 to heat a wafer substrate (not shown) held on wafer supporting surface 22 so that the wafer substrate reaches a desired temperature range suitable for processing. In an embodiment, the wafer substrate is processed in a CVD process, during which it is subjected to an elevated temperature of greater than 800° C. Under such a high processing temperature, significant heat stress is typically formed in the wafer substrate, which may cause the wafer substrate to bow or warp.

Figure 2B:
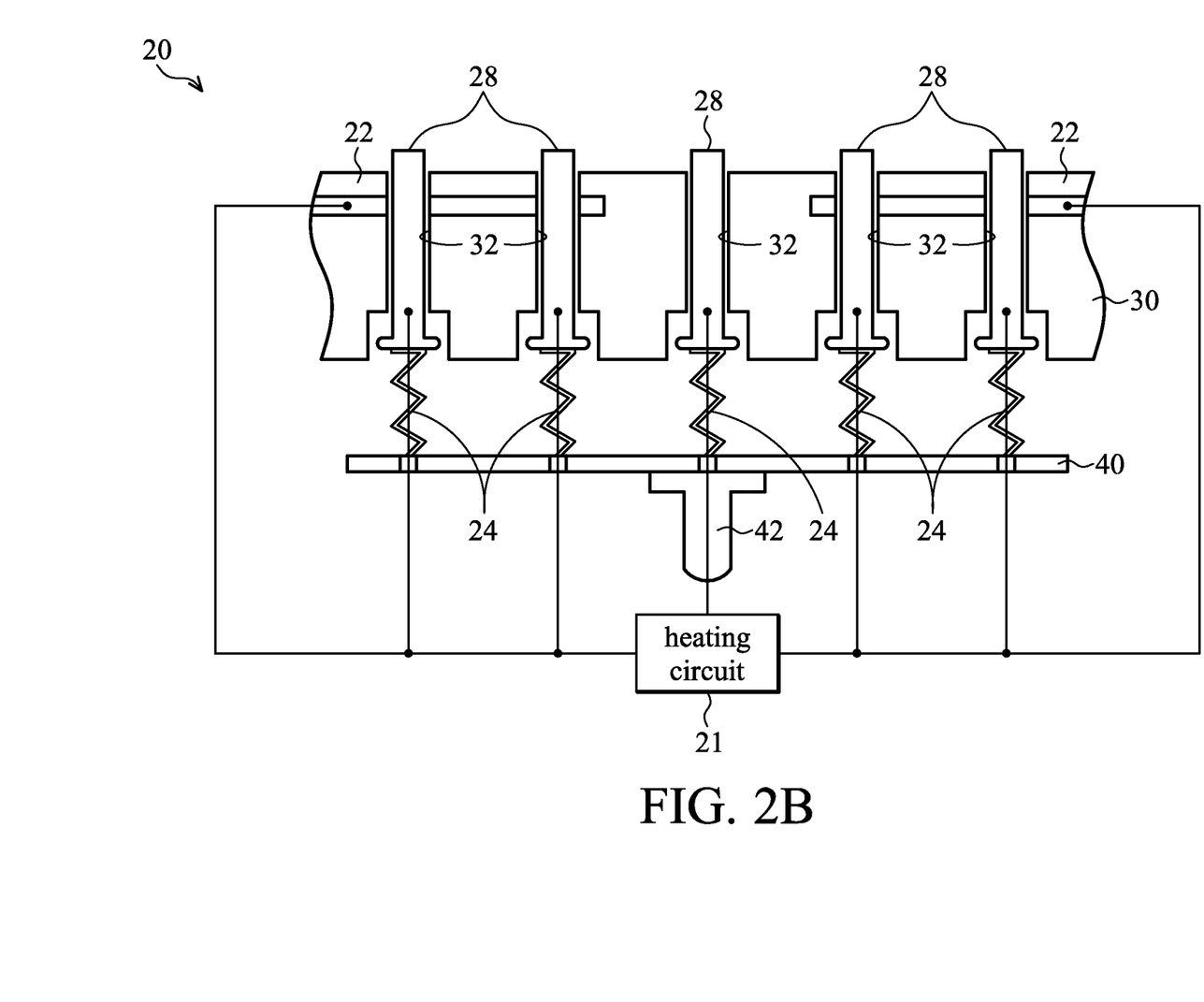

FIG. 2B illustrates another preferred embodiment, where each of the lift pins 28 is supported by an elastic spring 24 attached to a lift table 40. The lift table 40 is cantilevered from the top end of a rotation motor and cylinder 42 that is axially translated by a lift motor assembly. The rest position of lift pins 28 is adjustable by positioning lift table 40 axially. In another embodiment, lift table 40 may be fastened to supporting base 30. In an additional preferred embodiment, each of the lift pins 28 is supported by an air cylinder with sealed, compressive air that is used in place of an elastic spring. In preferred embodiments, lift pins 28 are free to move up and down axially. Preferably, when wafer holding apparatus 20 is idle, the tips of lift pins 28 protrude over the wafer supporting surface 22 to an extent that, when a wafer substrate to be processed is rested on wafer supporting surface 22, the weight of the wafer substrate presses down the lift pins 28 so that the wafer substrate forms a direct abutting contact with the wafer supporting surface 22.

Figure 3:
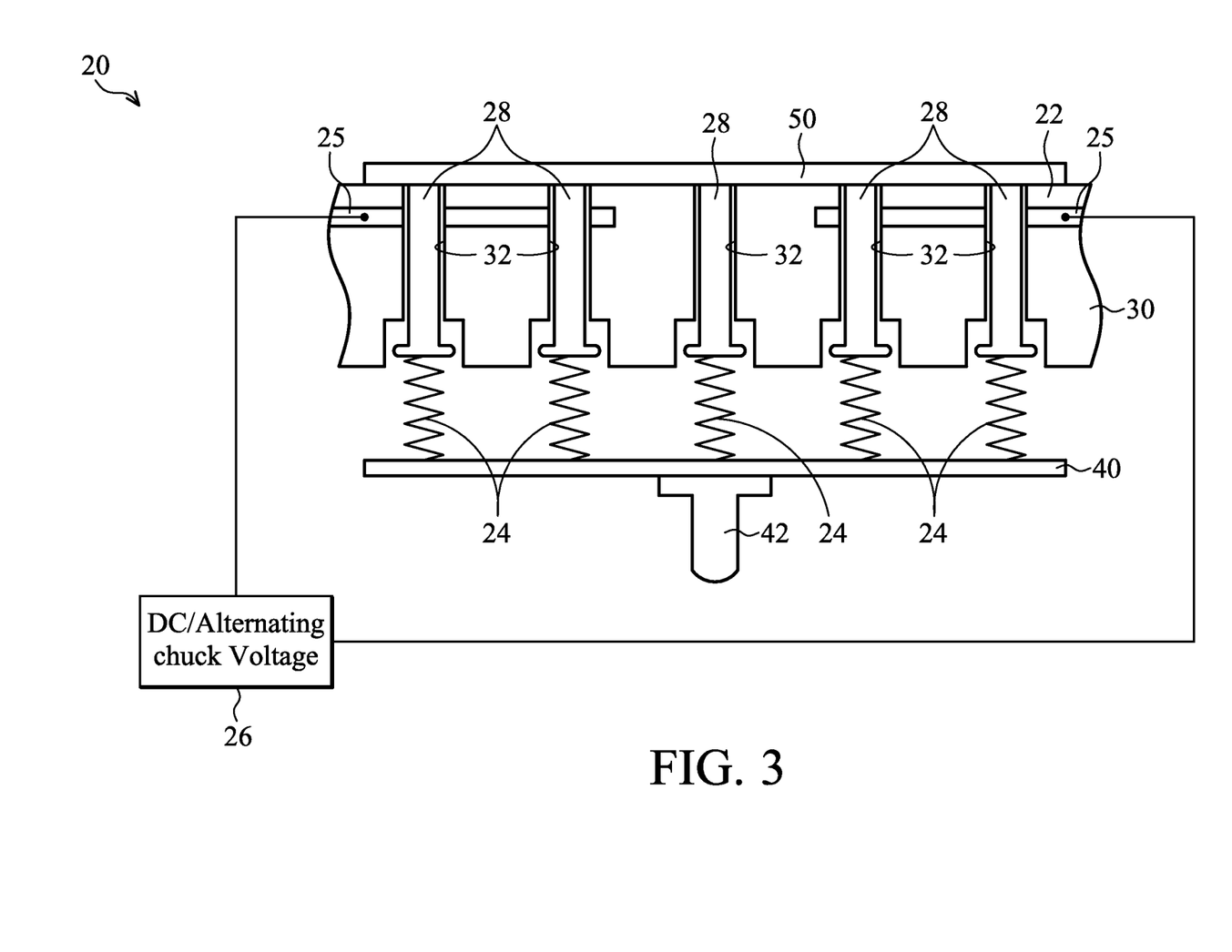

FIG. 3 illustrates wafer holding apparatus 20 with a wafer substrate 50 resting thereon. The back-end of wafer substrate 50 is in direct abutting contact with the wafer supporting surface 22 and lift pins 28. Optionally, when holding apparatus 20 is used in a plasma reactor chamber, such as a plasma enhanced CVD (PECVD) tool, heat conductive layer 22 may also encapsulate a thin planar chucking electrode or conductive grid 25, which is coupled to a DC or alternating chuck voltage source 26, forming a DC type or dipole-type electrostatic chuck configuration. When a DC chuck voltage is applied to the electrode 25, the wafer substrate 50 is typically referenced to ground through the plasma. The application of a large DC voltage to chucking electrode 25 produces a large electrostatic force that holds the wafer on wafer supporting surface 22. When an alternating voltage is applied between the electrodes 25, a reverse polarity charge is typically induced on the back side of wafer substrate 50. Wafer substrate 50 is thus attracted to wafer support surface 22 via the electrostatic force generated between wafer substrate 50 and electrodes 25.

It is noted that, although the above preferred embodiments are illustrated in conjunction with a CVD processing apparatus, those skilled in the art should realize that the preferred embodiments may be also applied to other wafer fabrication processes and apparatus where an elevated wafer temperature is needed, such as a rapid thermal process (RTP) using a hot chuck, a thermal anneal process (e.g., silicidation), and a metal deposition process, impurity doping, and the like, without departing from the scope and spirit of the present invention as specifically defined in the preferred embodiments.

Figure 4A:
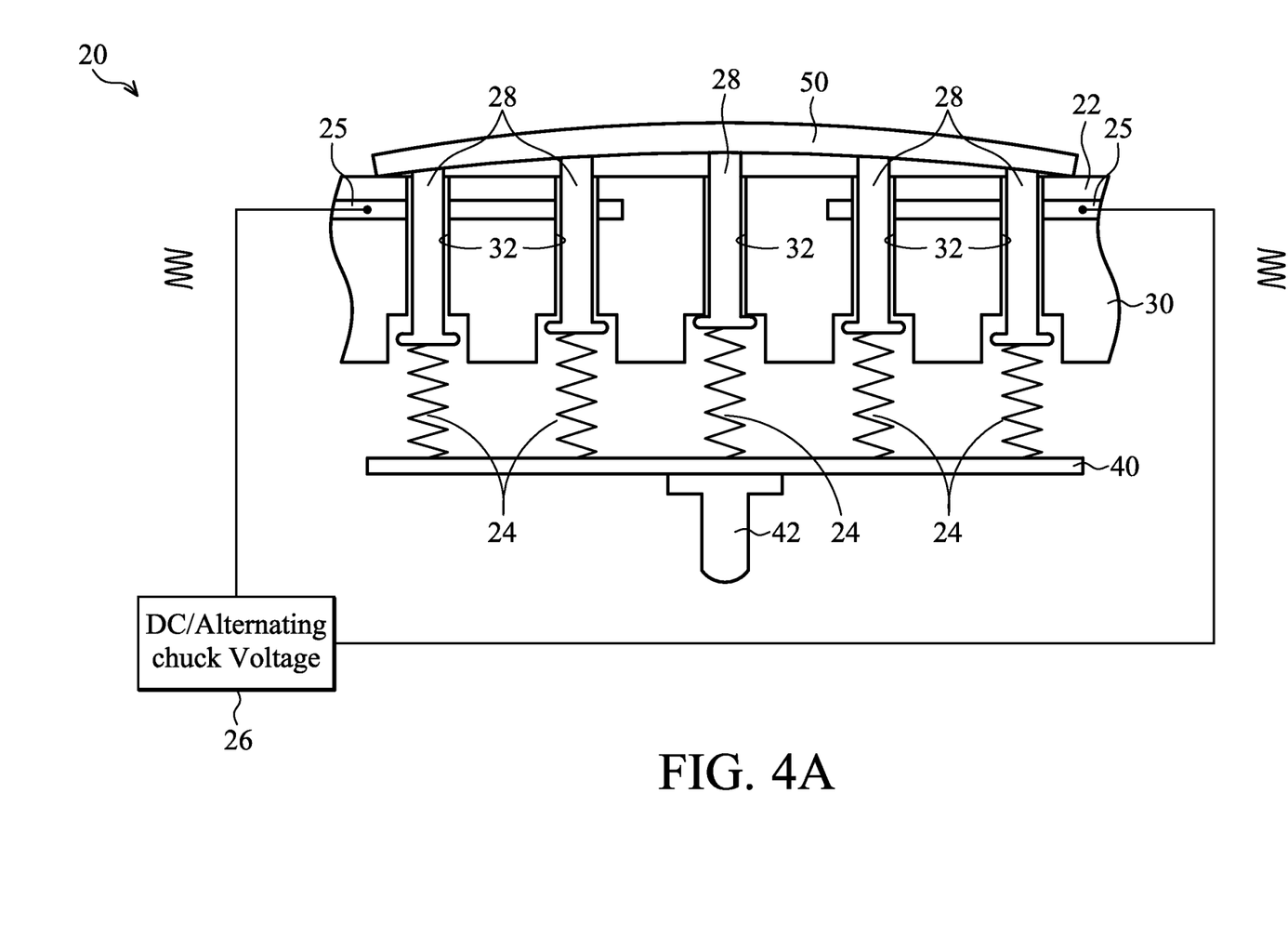
Figure 4B:
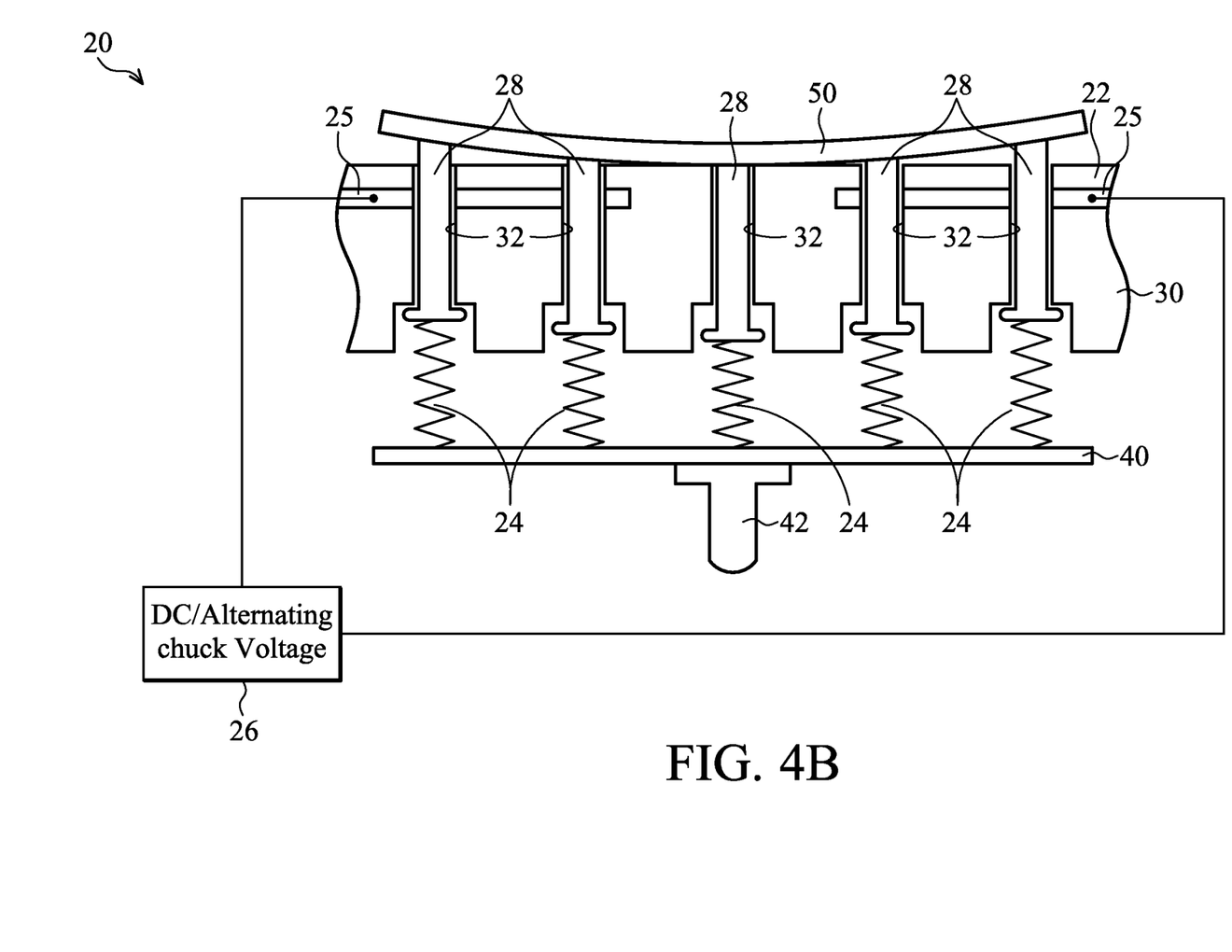

FIGS. 4A-4B are collectively used to illustrate bowing and warping that may occur to wafer substrate 50 when high heat stress is applied. The bowing and warping effects are exaggerated to illustrate the advantageous features achieved with the current embodiment. As can be seen from FIGS. 4A-4B, when an air gap is formed between the wafer substrate 50 and the wafer supporting surface 22 due to wafer bowing or warping, lift pins 28 attached to the compressed springs extend upwards above the wafer supporting surface 22 so that the top end of lift pins 28 makes direct contact with the back end of wafer substrate 50. Because lift pins 28 are also heated by being coupled to the supply electricity that is used to heat wafer supporting surface 22, wafer substrate 50 may be continuously heated by lift pins 28 even after direct abutting contact with the supporting surface 22 is lost due to wafer bowing or warping, thus leading to even temperature distribution on wafer substrate 50.

Figure 5:
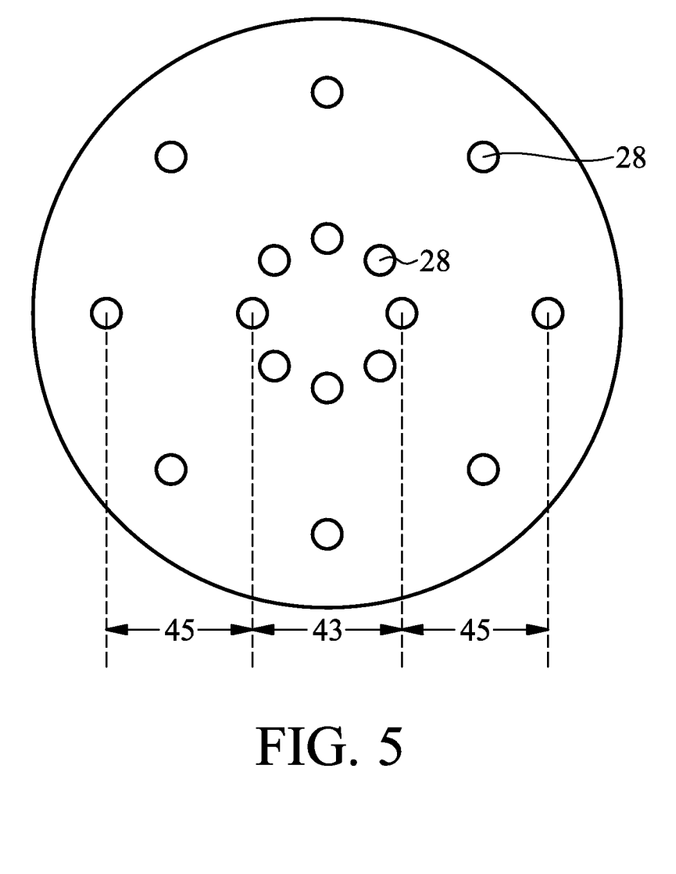
FIG. 5 shows a plan view of an illustrative embodiment of the present invention.

FIG. 5 is a plan view illustrating one preferred embodiment of the wafer holding apparatus 20, which comprises a plurality of lift pins 28 distributed in a concentric fashion in an inner zone 43 and an outer zone 45. It is noted that the pattern of the lift pins 28 shown in FIG. 5 is only for illustrative purpose and should not be construed as being limited to the pattern set forth herein. In reality, wafer holding apparatus 20 may be formed to include various lift pin 28 patterns depending upon the dimension of wafer substrate 50 to be processed, the desired process temperature, the temperature uniformity needed to process the wafer substrate without significant impact on the product yield.

It is noted, however, the dimension of lift pins 28 and the density of lift pins 28 may impact the securing of direct abutting contact between wafer substrate 50 and wafer supporting surface 22, thus providing even temperature distribution on wafer substrate 50. In preferred embodiments, the dimension (e.g., diameter) of lift pins 28 is preferably in the range of from about 1/100 of the wafer dimension to about 1/10 of the wafer dimension. The density of lift pins 28, measured by the pin-to-pin pitch, is optimized to provide even temperature distribution on wafer substrates with various materials and dimensions, and is preferably in the range of from about 1/50 of the wafer dimension (e.g., diameter) to about 1/10 of the wafer dimension. In preferred embodiments, the number of lift pins formed on a wafer holding apparatus ranges from just a few to over a hundred, depending upon the dimension of wafer substrate to be processed, the desired process temperature, and the temperature uniformity needed to process the wafer substrate without significant impact on the product yield. As an example shown in FIG. 5, a wafer holding apparatus with eight lift pins in inner zone 43 and eight lift pins in outer zone 45 may be used to process a III-V semiconductor wafer having a diameter of four inches. As another example, a wafer holding apparatus with a hundred lift pins may be employed to process a twelve-inch silicon wafer.

It is also noted that the DC or alternating chuck voltages applied to chucking electrode 25 may be varied through a control circuit so that the electrostatic force formed between wafer substrate 50 and electrodes 25 may be changed continuously or turned on and off intermittently, adapting to processes having different heat stress levels. As an example, during a high temperature process where even temperature distribution is highly critical, a large electrostatic force may be formed between wafer substrate 50 and electrodes 25, creating the desired direct abutting contact between wafer substrate 50 and wafer supporting surface 22. However, the high mechanical stress thus created in wafer substrate 50 may be quickly alleviated or released by reducing the electrostatic force formed between wafer substrate 50 and electrodes 25 through adjusting of the DC or alternating chuck voltages applied to chucking electrode 25.

Figure 6A:
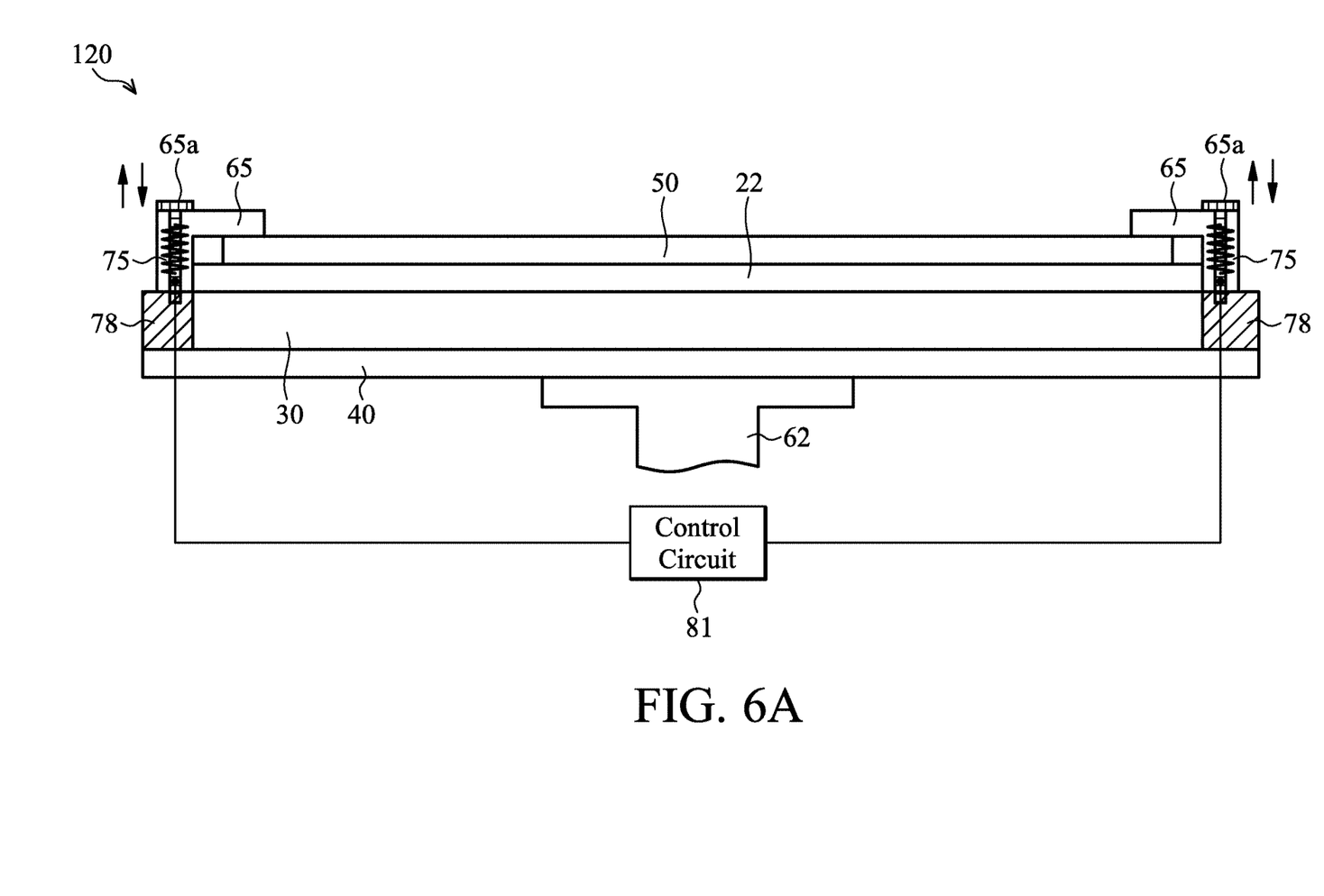
FIGS. 6A-6B illustrates a cross-sectional and a plan view, respectively, of an illustrative embodiment of the present invention.
Figure 6B:
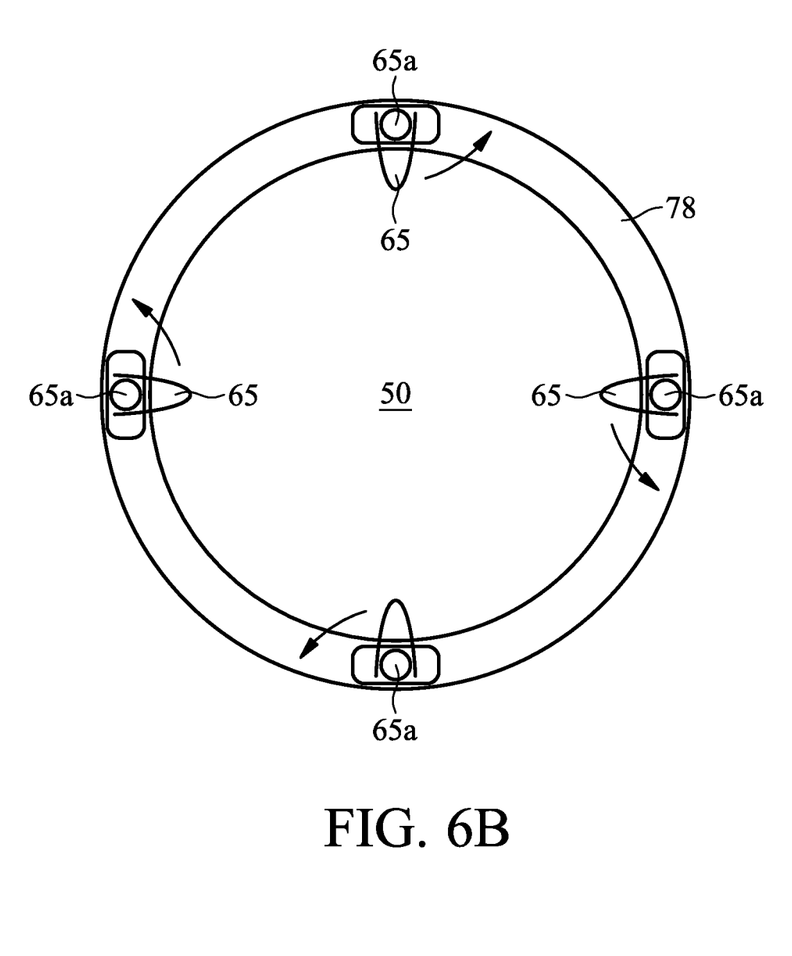

FIGS. 6A-6B are cross-sectional and plan views used to illustrate wafer holding apparatus 120 in another preferred embodiment. Wafer holding apparatus 120 comprises a heat-conductive layer 22, which is supported on a supporting base 30. The top surface of the heat-conductive layer 22 forms a wafer support surface. Wafer holding apparatus 120 also comprises a plurality of wafer substrate clampers 65 secured to a clamper supporting ring 78, which is fastened on the edge of supporting base 30. The clampers 65 can be rotated horizontally between a locked and unlocked position to secure wafer substrate 50 on heat-conductive layer 22. Alternatively, clampers 65 may be lowered and raised between locked and unlocked positions. A heating circuit is used to supply electricity to the wafer supporting surface 22 to heat wafer substrate 50 held thereon so that wafer substrate 50 reaches a desired temperature range suitable for processing. Optionally, supporting base 30 is secured on lift table 40, which is cantilevered from the top end of a rotation motor or cylinder 62 that is axially translated by a lift motor assembly.

Each of the clampers 65 may be attached onto the clamper supporting ring 78 at one end by a fastener 65a. The clampers 65 are used to secure a direct abutting contact between wafer substrate 50 and wafer supporting surface 22 during a high temperature process where even temperature distribution is highly critical. However, the elastic spring 75 may be deactivated through a control circuit 81 so that the clamping force on the edge of wafer substrate 50 can be relieved instantaneously. In other words, in some embodiments, elastic spring 75 may have an electromechanical component such as an electromagnet or may comprise a material that deforms in the presence of an electrical field or electric current. As a result, the high mechanical stress created in wafer substrate 50 during a high temperature process may be quickly alleviated or released by removing the clamping force on wafer substrate 50. In a preferred embodiment, elastic springs 75 in clampers 65 are activated and deactivated in an intermittent manner, adapting to processes having different heat stress levels. As an example, during a high temperature process where even temperature distribution is highly critical, clampers 65 are activated securing the desired direct abutting contact between wafer substrate 50 and wafer supporting surface 22. After that, the high mechanical stress thus created in wafer substrate 50 may be quickly alleviated or released by deactivating clampers 65, thus removing the clamping force on wafer substrate 50. In some embodiments, clampers 65 may be used in combination with lift pins 28, such as illustrated in FIGS. 4A and 4B to provide even further flexibility in control the transfer of heat to a substrate 50.

Figure 7A:
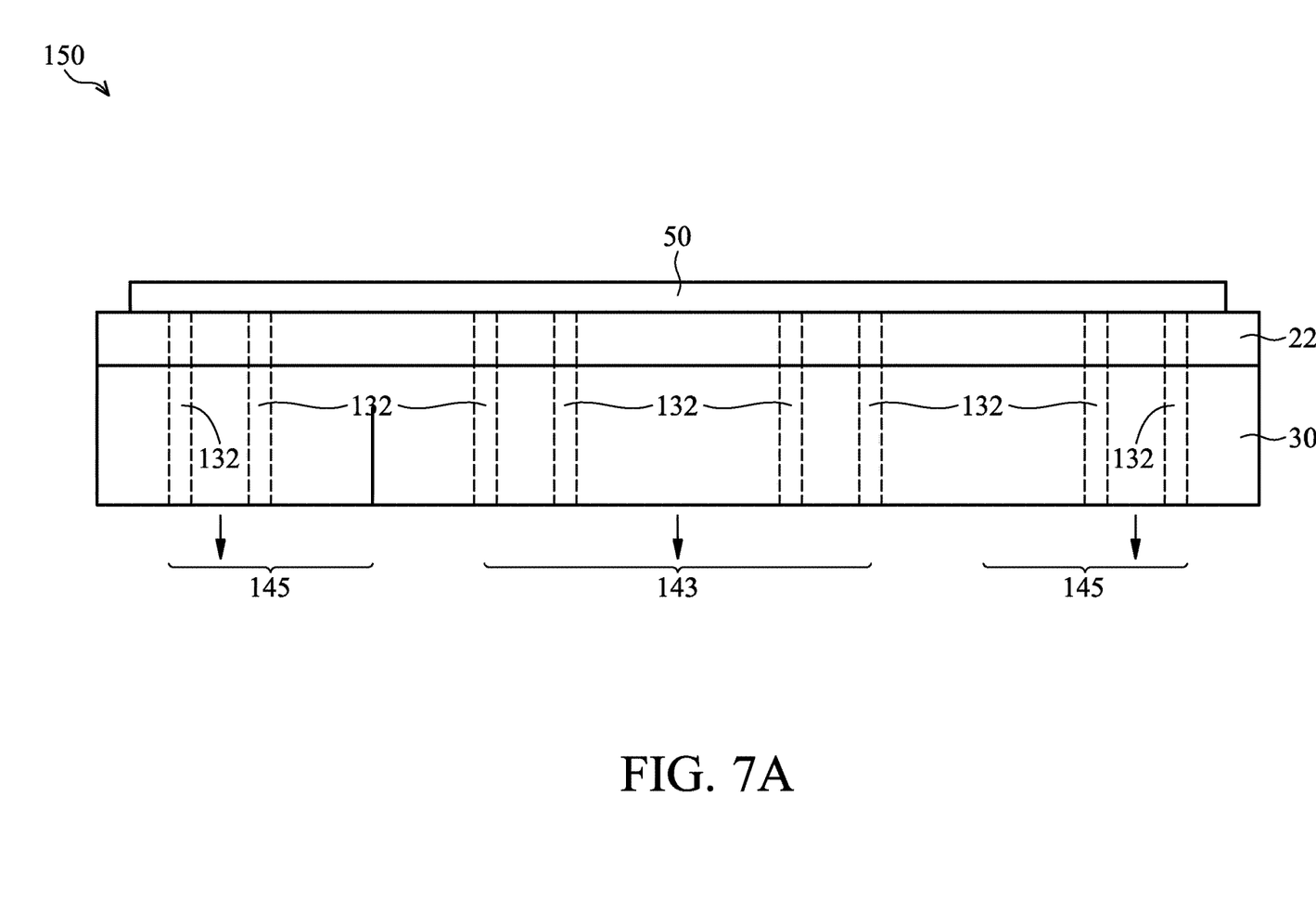
FIGS. 7A-7B illustrates a cross-sectional and a plan view, respectively, of an illustrative embodiment of the present invention.
Figure 7B:
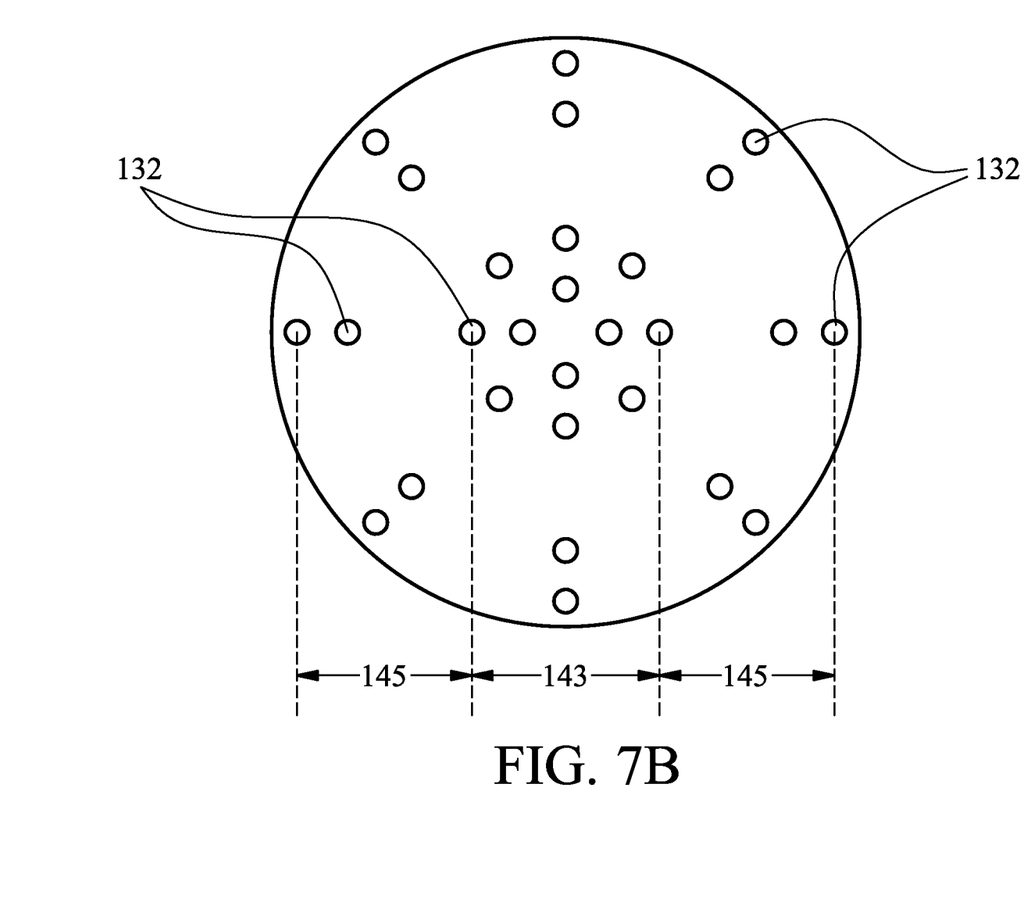

FIGS. 7A-7B are cross-sectional and plan views used to illustrate wafer holding apparatus 150 in an alternative or additional preferred embodiment. Wafer holding apparatus 150 comprises a heat-conductive layer 22. The heat-conductive layer 22 is supported on a supporting base 30, with the top surface of the heat-conductive layer 22 forming a wafer support surface. One skilled in the art will recognize that a lift table 40, such as illustrated in FIG. 4A could also be employed in the embodiment illustrated in FIG. 7A. A heating circuit (not shown) is preferably used to supply electricity to the wafer supporting surface 22 and to heat wafer substrate 50 held thereon so that wafer substrate 50 reaches an even temperature distribution in a desired temperature range suitable for processing. A plurality of holes 132 are formed through heat-conductive layer 22 and supporting base 30. The holes 132 are preferably distributed in a concentric fashion with an inner zone 143 and an outer zone 145. The inner zone 143 and the outer zone 145 at the back end of supporting base 30 may be connected to same or separate vacuum sources. When one or more of the vacuum sources are turned on, attractive forces are formed on the wafer supporting surface 22, holding wafer substrate 50 thereon for the desired process. In the current embodiment, the attractive forces at the inner and outer vacuum zones 143 and 145 can be turned on and off in an intermittent manner by a vacuum source control circuit. For example, in a high temperature process where even temperature distribution is highly critical, all the vacuum sources may be turned on to secure direct abutting contact between wafer substrate 50 with the wafer supporting surface 22. After that, the attractive forces may be quickly relieved by turning off one or more of the vacuum sources, allowing high mechanical stress created in wafer substrate 50 to be quickly alleviated or released.

The dimension (e.g., diameter) of holes 132 and the density of holes 132 formed on a wafer supporting surface 22 may impact the securing of direct abutting contact between wafer substrate 50 and wafer supporting surface 22, thus providing even temperature distribution on wafer substrate 50. In preferred embodiments, the dimension (e.g., diameter) of holes 132 is preferably in the range of from about 1/100 of the wafer dimension to about 1/10 of the wafer dimension. The density of holes 132, measured by the hole-to-hole pitch, is optimized for processing wafer substrates of various materials and dimensions, and is preferably in the range of from about 1/50 of the wafer dimension (e.g., diameter) to about 1/10 of the wafer dimension. In preferred embodiments, the number of holes 132 formed on a wafer holding apparatus ranges from just a few to over a hundred, depending upon the dimension of wafer substrate to be processed, the desired process temperature, and the temperature uniformity needed to process the wafer substrate without significant impact on the product yield. As an example, a wafer holding apparatus with eight holes on wafer supporting surface 22 may be used to secure a III-V semiconductor wafer having a diameter of four inches, while a wafer holding apparatus with a hundred holes on wafer supporting surface 22 may be employed to process a twelve-inch silicon wafer. While four concentric rings of holes 132 are illustrated in FIG. 7B, those skilled in the art will recognize numerous variations in the size, pattern, and placement of the holes is obtainable through routine experimentation.

Embodiments disclosed herein provide a wafer holding apparatus that comprises a heat-conductive layer disposed on a supporting base, and a plurality of heat-conductive lift pins coupled to a heating circuit. The heat-conductive lift pins can extend through the holes over the heat-conductive layer at the top end, and make a direct contact with a wafer substrate even after a direct abutting contact between the wafer substrate and the supporting surface is lost due to wafer bowing or warping, thus leading to even temperature distribution on a wafer substrate.

In accordance with a preferred embodiment of the present invention, a wafer holding apparatus for processing a semiconductor wafer comprises a heat-conductive layer disposed on a supporting base, the heat-conductive layer being coupled to a heating circuit, a plurality of holes formed through the heat-conductive layer and the supporting base, and a plurality of heat-conductive lift pins coupled to the heating circuit and extending through the holes and over the heat-conductive layer, each of the plurality of lift pins having a top end for making direct contact with a wafer.

In accordance with another preferred embodiment of the present invention, a wafer holding apparatus for processing a semiconductor wafer comprises a heat-conductive layer disposed on a supporting base, the heat-conductive layer being coupled to a heating circuit, a clamper supporting ring fastened on an edge of the supporting base, a plurality of wafer substrate clampers attached to the clamper supporting ring, and a control circuit coupled to the plurality of wafer substrate clampers for clamping and unclamping the plurality of wafer substrate clampers.

In accordance with yet another preferred embodiment of the present invention, a heater used for processing a semiconductor wafer comprises a heat-conductive layer disposed on a supporting base, the heat-conductive layer being coupled to a heating circuit, a first plurality of holes formed through the heat-conductive layer, the first plurality of holes being distributed in an inner zone near the center of the heat-conductive layer and an outer zone near the edge of the heat-conductive layer, a first vacuum source coupled to the holes in the inner zone, and a second vacuum source coupled to the holes in the outer zone.

Although the preferred embodiments and their advantages have been described in detail, it should be understood that various changes, substitutions and alterations can be made herein without departing from the spirit and scope of the invention as defined by the appended claims. As an example, it will be readily understood by those skilled in the art that components, materials, and configurations according to the preferred embodiments described above may be varied, substituted, or combined to form even more wafer holding apparatus, while remaining within the scope of the present invention.

Moreover, the scope of the present application is not intended to be limited to the particular embodiments of the process, machine, manufacture, composition of matter, means, methods and steps as described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A wafer holding apparatus for processing a semiconductor wafer comprising:
    a heat-conductive layer disposed on a supporting base, the heat-conductive layer being coupled to an electrical heating circuit;
    a wafer retainer configured to retain a wafer on the heat-conductive layer, the wafer retainer including a clamper supporting ring and a plurality of wafer substrate clampers, the clamper supporting ring being disposed outside an outermost diameter of the supporting base, each of the wafer substrate clampers being fastened to the clamper supporting ring by a fastener, the fastener extending from above a top surface of the wafer substrate clamper to below a bottom surface of the wafer substrate clamper, each of the wafer substrate clampers comprising a spring having an electromagnet;
    a control circuit coupled to the spring of each of the wafer substrate clampers, the control circuit being configured to control the spring of each of the wafer substrate clampers to control a clamping force; and
    a lift pin extending through the supporting base, the lift pin being connected to the electrical heating circuit, the lift pin being supported by a sealed air cylinder, the lift pin and the heat-conductive layer comprising pyrolytic boron nitride.

2. The wafer holding apparatus according to claim 1, wherein the control circuit is configured to cause the wafer retainer to clamp the wafer during a first portion of wafer heat processing and is further configured to cause the wafer retainer to unclamp the wafer during a second portion of wafer heat processing different than the first portion.

3. The wafer holding apparatus according to claim 2, wherein:
    the clamper supporting ring is fastened on an edge of the supporting base.

4. The wafer holding apparatus according to claim 2, further comprising:
    a second plurality of holes formed through the heat-conductive layer; and
    wherein the lift pin comprises a plurality of heat-conductive pins extending through the holes and over the heat-conductive layer during wafer heat processing, each of the plurality of heat-conductive pins having a top end for making direct contact with a wafer.

5. The wafer holding apparatus according to claim 4, wherein each of the plurality of heat-conductive pins are disposed in respective ones of the second plurality of holes and coupled to the electrical heating circuit, wherein the sealed air cylinder comprises a plurality of air cylinders, wherein the plurality of air cylinders are disposed between each of the plurality of heat-conductive pins and a fixed bottom surface of a respective one of the second plurality of holes, each of the plurality of heat-conductive pins independently extending above a top surface of the heat-conductive layer during wafer heating and contacting and heating the wafer while extended above the top surface of the heat-conductive layer.

6. The wafer holding apparatus according to claim 4, wherein the supporting base comprises a wafer holding region, the wafer holding region having a first diameter, and wherein a second diameter of each heat-conductive pin of the plurality of heat-conductive pins is between about $1/100$ and about $1/10$ of the first diameter.

7. The wafer holding apparatus according to claim 1, wherein the spring is disposed within each of the wafer substrate clampers, wherein the spring encircles at least a portion of the fastener.

8. A wafer holding apparatus for processing a semiconductor wafer comprising:
   a heat-conductive layer disposed on a supporting base, the heat-conductive layer being coupled to a heating circuit;
   a plurality of heat-conductive lift pins being electrically coupled to the heating circuit, wherein each of the heat-conductive lift pins has a rest position in which a top surface of the heat-conductive lift pin is disposed above a top surface of the heat-conductive layer, and wherein each of the heat-conductive lift pins is configured to contact a wafer during a wafer heat processing when the wafer is bowed or warped;
   a clamper supporting ring fastened on a circumferential surface of the supporting base, the clamper supporting ring being discrete from the supporting base;
   a plurality of wafer substrate clampers attached to the clamper supporting ring, wherein bottom surfaces of the plurality of wafer substrate clampers are in contact with a top surface of the clamper supporting ring, wherein each of the wafer substrate clampers comprises an elastic spring, and wherein each of the elastic springs comprises an electromagnet; and
   a control circuit coupled to each of the elastic springs of the wafer substrate clampers, the control circuit being configured to control the elastic springs for clamping and unclamping the plurality of wafer substrate clampers.

9. The wafer holding apparatus according to claim 8, wherein the control circuit is configured to cause the wafer substrate clampers to clamp a wafer during a first portion of wafer heat processing and is further configured to cause the wafer substrate clampers to unclamp the wafer during a second portion of wafer heat processing different than the first portion.

10. The wafer holding apparatus according to claim 8, further comprising:
    a plurality of holes formed through the heat-conductive layer, the plurality of heat-conductive lift pins extending through the holes.

11. The wafer holding apparatus according to claim 10, wherein each of the plurality of heat-conductive lift pins are disposed in respective ones of the plurality of holes coupled to the heating circuit, a compressible member disposed between each of the plurality of heat-conductive lift pins and a lift table, each of the plurality of heat-conductive lift pins independently extending above a top surface of the heat-conductive layer during wafer heating and contacting and heating the wafer while extended above the top surface of the heat-conductive layer.

12. The wafer holding apparatus according to claim 11, wherein the supporting base comprises a wafer reception region, and wherein a diameter of each of the plurality of heat-conductive lift pins is between about $1/100$ and about $1/10$ of a diameter of the wafer reception region.

13. The wafer holding apparatus according to claim 8, wherein the heat-conductive lift pins and the heat-conductive layer comprise pyrolytic boron nitride.

14. A wafer processing apparatus, comprising:
    a heat conductive layer electrically coupled to a heating circuit;
    a supporting base comprising a clamper supporting ring and a wafer reception region, the wafer reception region having a first diameter;
    a lift pin having a second diameter, the second diameter being between about $1/100$ and about $1/10$ of the first diameter, the lift pin electrically coupled to the heating circuit, the lift pin being supported by an air cylinder, wherein the lift pin and the heat conductive layer comprise pyrolytic graphite;
    a clamper, the clamper comprising a first surface substantially perpendicular to a major surface of the heat conductive layer and a second surface substantially perpendicular to the first surface, the second surface being configured to contact an upper surface of a wafer;
    a fastener extending through the clamper and into the supporting base, the fastener attaching the clamper to the clamper supporting ring;
    a first elastic spring surrounding the fastener, the first elastic spring comprising an electromagnet; and
    a control circuit coupled to the first elastic spring, the control circuit being configured to control the first elastic spring to control a clamping force of the clamper.

15. The wafer processing apparatus of claim 14, wherein each of the fastener and the first elastic spring extend through a first portion of the clamper.

16. The wafer processing apparatus of claim 14 further comprising:
    a hole extending through the heat conductive layer and the supporting base, the lift pin extending through the hole; and
    a lift table, wherein the air cylinder is interposed between the lift pin and the lift table.

17. The wafer processing apparatus of claim 16, wherein the lift table is connected to a rotation motor.

18. The wafer processing apparatus of claim 14, wherein the clamper supporting ring has an inner diameter greater than an outer diameter of the wafer reception region.

* * * * *